US006987053B2

(12) United States Patent
Wu et al.

(10) Patent No.: US 6,987,053 B2
(45) Date of Patent: Jan. 17, 2006

(54) METHOD OF EVALUATING RETICLE PATTERN OVERLAY REGISTRATION

(75) Inventors: Wen-Bin Wu, Taoyuan Hsien (TW); Chih-Yuan Hsiao, Taipei (TW); Hui-Min Mao, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 18 days.

(21) Appl. No.: 10/792,345

(22) Filed: Mar. 3, 2004

(65) Prior Publication Data

US 2005/0048654 A1 Mar. 3, 2005

(30) Foreign Application Priority Data

Sep. 2, 2003 (TW) ....................................... 92124185 A

(51) Int. Cl.
*H01L 21/76* (2006.01)

(52) U.S. Cl. ......................................... 438/401; 438/13

(58) Field of Classification Search .................. 438/14, 438/401
See application file for complete search history.

(56) References Cited

U.S. PATENT DOCUMENTS

2004/0054981 A1 3/2004 Okagawa et al.

*Primary Examiner*—Long Pham
(74) *Attorney, Agent, or Firm*—Quintero Law Office

(57) ABSTRACT

A method for evaluating reticle registration between two reticle patterns. A wafer is defined and etched to form a first exposure pattern, by photolithography with a first reticle having a first reticle pattern thereon. A photoresist layer is formed over the wafer and defined as a second exposure pattern, by photolithography with a second reticle having a second reticle pattern thereon. A deviation value between the first and second exposure patterns is measured by a CD-SEM. The deviation value is calibrated according to the scaling degree and the overlay offset to obtain a registration data. The reticle registration between the two reticle patterns is evaluated based on the registration data.

22 Claims, 12 Drawing Sheets

METHOD OF EVALUATING RETICLE PATTERN OVERLAY REGISTRATION

BACKGROUND OF THE INVENTION

1. Field of the Invention

The present invention relates to semiconductor fabrication, and in particular to a method of checking overlay registration between every two reticle patterns for photolithography.

2. Description of the Related Art

Each lithography step uses a pattern referred to as a layer, such as a(n) patterned conductive layer, semiconductor layer or insulating layer. In order to make semiconductor devices, each photolithography reticle or mask corresponding to a certain structural pattern must be aligned with the semiconductor substrate for overlay registration before exposure.

Conventionally, corresponding alignment marks or features are set on a semiconductor substrate, i.e. a wafer, and the reticle respectively for alignment. Often alignment marks are included in other layers, as the original alignment marks may be obliterated as processing progresses. It is important for each alignment mark on the wafer to be labeled so it may be identified, and for each pattern to specify the alignment mark (and the location thereof) to which it should be aligned. By providing the location of the alignment mark, it is easy to locate the correct feature in a short time. Each layer should have an alignment feature so that it may be registered to the rest of the layers.

Generally, reticle providers usually provide registration specifications for patterns on the reticles. The exposure is performed by aligning the alignment marks directly. FIG. 1 shows a conventional alignment for exposure between a reticle pattern and a wafer. Four alignment marks 12 are disposed on a wafer 10. Four alignment marks 22 on four corners of an exposure pattern 20 on a reticle are positioned to align with the four alignment marks 12, thereby ensuring the pattern 20 is transferred precisely to the predetermined area on wafer 10.

During the exposure, alignment between the reticle pattern 20 and the wafer 10 is accomplished by alignment marks thereon. However, inherent errors within the reticle pattern 20 cannot be adjusted by the exposure alignment. For semiconductor devices requiring multi-level alignment, inherent error addition between two continuous or discontinuous layer patterns may exceed the original specification. Due to shrinking feature sizes, the tolerances for overlay registration of the reticle pattern to the wafer are also reduced.

Conventionally, alignment registration is inspected by preparing thin sections of the testing layers formed on a wafer and viewing by an X-SEM (X-ray scanning electron microscope). FIG. 2 is a profile of an X-SEM section, showing the overlay registration between three layers. The disadvantage of X-SEM sections is they can only show the overlay registration of certain cross-sections of the wafer, not deviations of the alignment in a whole picture. In addition, when CD-SEM is utilized for inspection, designed to inspect critical dimension (CD) for semiconductor devices, the conventional bottom anti-reflection coating (BARC) widely used for photolithography improvement interferes with the detection signals from CD-SEM, thereby causing difficulty in viewing the overlay registration by CD-SEM

SUMMARY OF THE INVENTION

One object of the invention is to provide a method for evaluation overlay registration of reticle patterns.

Another object of the invention is to provide a method for evaluating overlay registration between two discontinuous reticle patterns.

Still another object of the invention is to provide a method for fabricating a wafer sample for CD-SEM inspection of overlay registration.

To achieve the objects, the present invention provides a method for fabricating a wafer sample for evaluating the overlay registration between reticle patterns. A first pattern is formed on a wafer by photolithography with a first reticle having a first reticle pattern thereon. A photoresist layer is then formed on the wafer. The photoresist layer is patterned to form a second pattern by photolithography with a second reticle having a second reticle pattern thereon. Deviations are measured between the first and second patterns on the wafer along X-, Y- or X and Y axes. A scaling value and an overlay offset of the deviations are calibrated to obtain an overlay registration value. Whether the registration value is out of a specification is determined according to the calibrated values.

In an embodiment, a bottom anti-reflection layer (BARC) can be formed between the wafer and the photoresist layer. After the photoresist layer and the bottom anti-reflection layer are patterned as the second pattern, the bottom anti-reflection layer is removed by over-etching to provide a clearer profile of the first and second patterns for measurement.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The present invention is applicable to series of reticles for photolithography to check the overlay between two continuous or discontinuous reticle patterns. For example, the reticle can comprise a pattern thereon defining active regions (AA), gate layers (GC), deep trenches for capacitors (DT), contact openings (CS), bit line openings (CB) or a layer of interconnection on a semiconductor substrate. It is of note that the present invention is not limited thereto, being also applicable to reticles with other patterns, depending on the construction of the corresponding semiconductor device.

According to the present invention, two continuous reticle patterns, such as reticles for deep trenches for capacitors and the reticle for active regions, or two discontinuous reticle patterns, such as those of deep trenches for capacitors and for gate layers. The deviating orientation between the patterns depends on their corresponding layout. Generally, the deviation may be along X- or Y- axes, or X- and Y- axes, depending on which two reticle patterns are overlaid.

Figure 1:
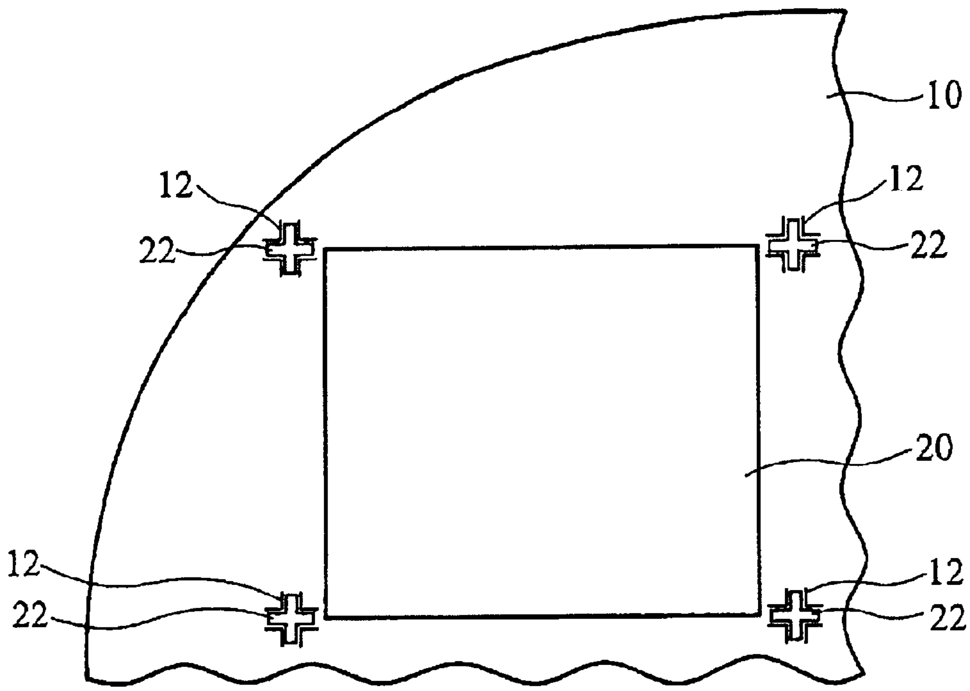
FIG. 1 shows a conventional alignment for exposure between a reticle pattern and a wafer.
Figure 2:
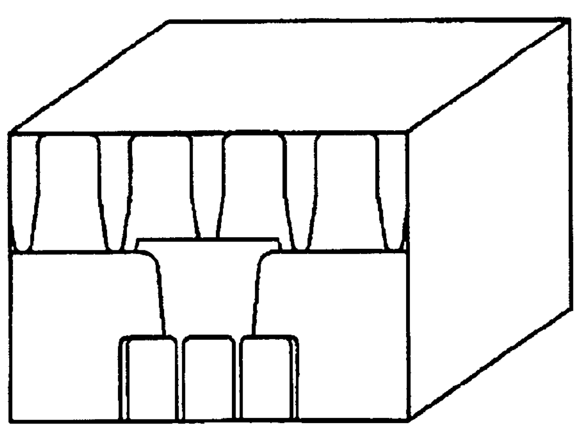
FIG. 2 is a conventional profile of an X-SEM section, showing the overlay registration between three layers.
Figure 3:
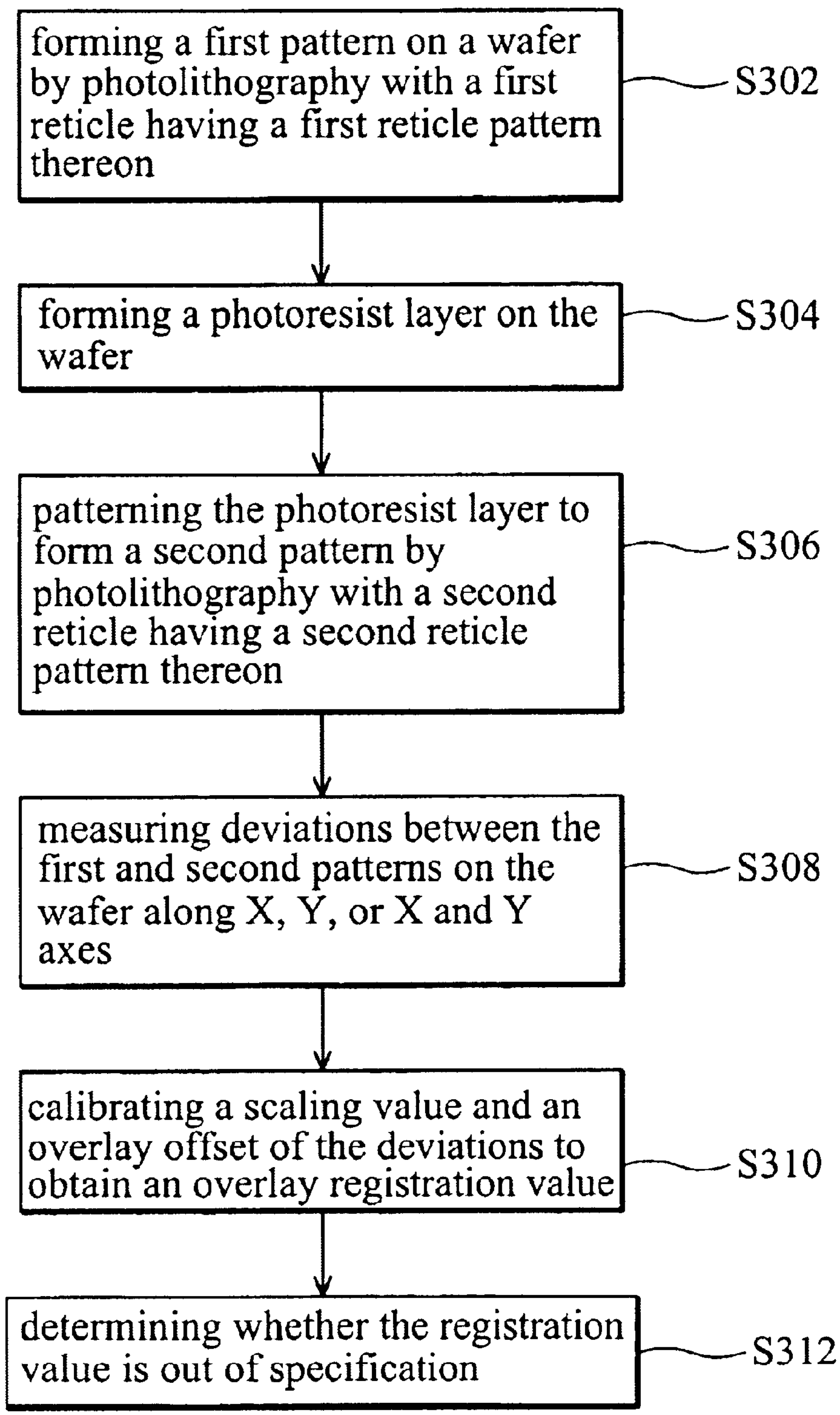
FIG. 3 is a flowchart of a method for evaluating overlay registration according to an embodiment of the invention.

FIG. 3 is a flowchart of a method for evaluating overlay registration according to an embodiment of the invention. The embodiment is described in accordance with FIG. 3, illustrating an evaluation of overlay registration between a reticle pattern for deep trench capacitors and a reticle pattern for active regions. FIGS. 4A to 4E are cross-sections showing the process for fabricating a wafer sample with the two reticle patterns.

Figure 4A:
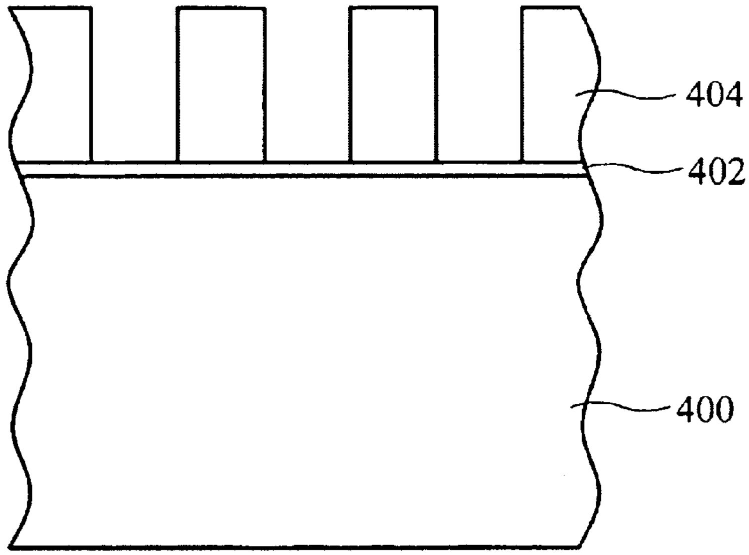
FIGS. 4A to 4E are cross-sections showing the process for fabricating a wafer sample with two mask patterns according to an embodiment of the invention.
Figure 4B:
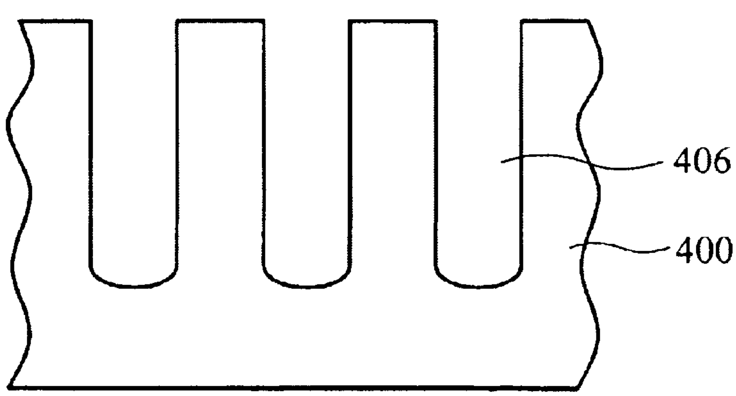
Figure 4C:
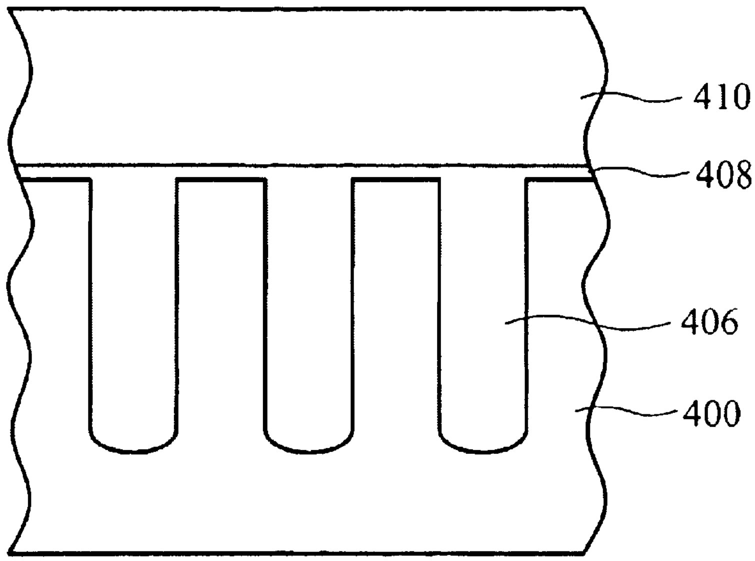

In step S302, a first pattern is formed on a wafer 400 by photolithography with a first reticle having a first reticle pattern thereon, as shown in FIG. 4A. A photoresist layer 404 is deposited on the surface of the wafer 400. Preferably, a bottom anti-reflection layer (BARC) 402 is formed on the wafer 400 before forming the photoresist layer 404 for improving the quality of photolithography. A reticle with a reticle pattern of deep trench capacitors (not shown) is utilized to form a patterned photoresist layer by photolithography. The wafer 400 is then etched to about 1000 Å with the patterned photoresist layer 404 as a mask to form deep trenches 406 for capacitor on the wafer 400 as shown in FIG. 4B. The patterned photoresist layer 404 and bottom anti-reflection layer (BARC) 402 are then removed, forming a wafer 400 with deep trenches 406.

In step 304, a photoresist layer is then formed on the wafer. Preferably, a bottom anti-reflection layer (BARC) 408 is formed on the wafer 400 to fill the deep trenches 406 and then the second photoresist layer 410 is formed on the BARC layer 408.

Figure 4D:
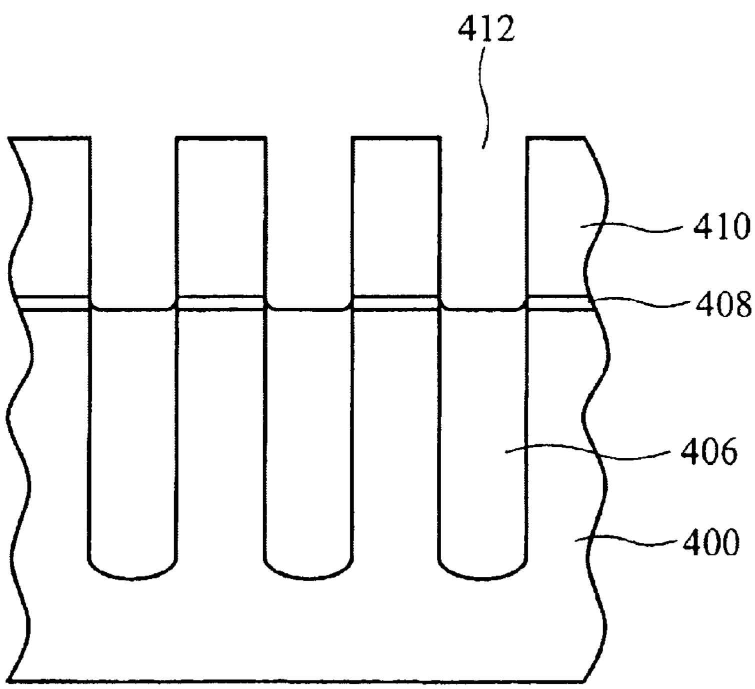

In step S306, the photoresist layer is patterned to form a second pattern by photolithography with a second reticle having a second reticle pattern thereon, as shown in FIG. 4D. A reticle with a reticle pattern for defining active regions (not shown) is utilized for patterning the photoresist layer 410 by photolithography to form an active region pattern 412. The exposed anti-reflection layer (BARC) 408 is then etched with the patterned photoresist layer 410 as a mask to form active region openings. In a preferred embodiment, the exposed anti-reflection layer (BARC) 408 is etched for about 5 seconds to form a clearer pattern of active regions 412, as shown in FIG. 4E.

According to the above steps, the pattern on the first reticle is transferred to wafer 400 and the pattern on the second reticle is transferred to the photoresist layer 410 on wafer 400, thereby simplifying the fabrication of a wafer sample for overlay registration.

Figure 4E:
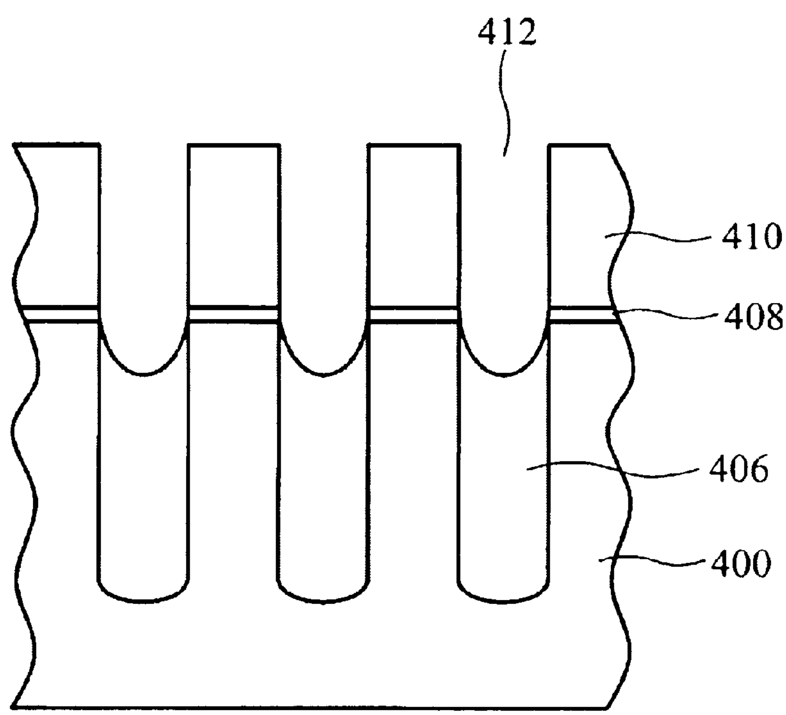

According to the above steps, the wafer sample as shown in FIG. 4E can be measured from the top view thereof to evaluate the overlay accuracy between the deep-trench pattern 406 on the wafer 400 and the active-region pattern 412 on the photoresist layer 410. However, a wafer sample of any two reticle patterns can be formed accordingly and the invention is not limited thereto. In addition, over-etching of exposed anti-reflection layer (BARC) 408 also helps reduce interference during observation with a CD-SEM.

After the wafer sample is obtained, step S308 measures deviations between the first and second patterns on the wafer along X-, Y- or X and Y axes. The definition of X- and Y- axes can be pre-determined by marking a first axis of the wafer sample and then a second axis perpendicular to the fist axis.

Figure 5A:
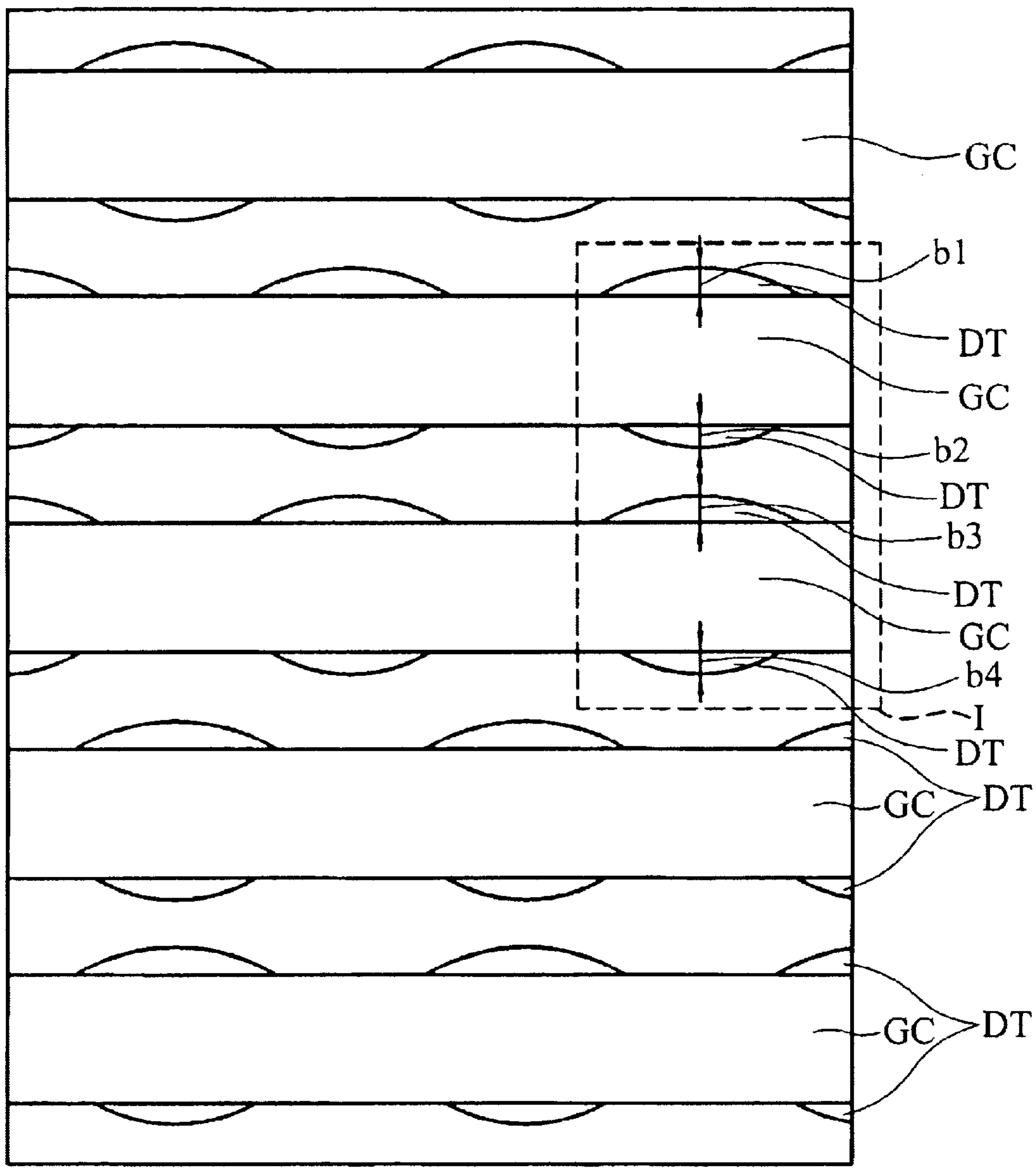
FIGS. 5A and 5B are top views showing the measurement of pattern overlay on a wafer sample by a CD-SEM according to an embodiment of the invention.
Figure 5B:
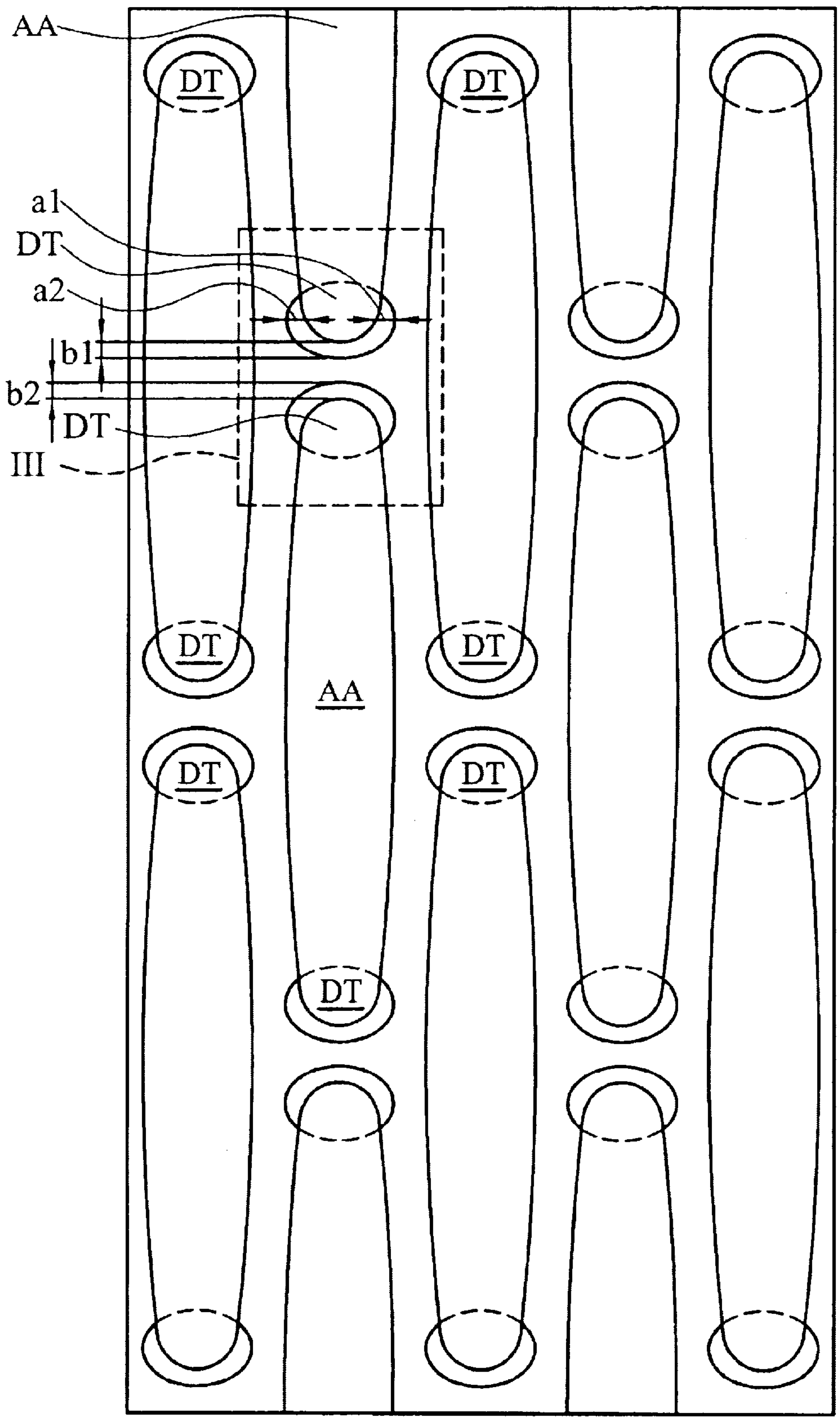

FIGS. 5A and 5B are top views showing two types of patterns overlaid on a wafer sample of the invention. FIG. 5A shows a pattern overlay between a gate-layer (GC) pattern and a deep-trench (DT) pattern according to an embodiment of the invention. The wafer sample of GC and DT can be observed by a CD-SEM from the top. As shown in FIG. 5A, in the region I of the wafer sample, the DTs exceeding GCs along y-axis are measured. The pattern deviation of region I of DTs is:

$$Y_I = \frac{(b_1 - b_2)/2 + (b_3 + b_4)/2}{2}$$

Due to the DT pattern in a unit of two deep trenches, deviation thereof is also the average of two. However, the deviation in the DT pattern can still be calculated solely in accordance with the layout of the deep trenches, as follows:

$$Y_{I-1} = \frac{(b_1 - b_2)}{2} \quad \text{and} \quad Y_{I-2} = \frac{(b_3 - b_4)}{2}$$

FIG. 5B shows a pattern overlay between an active-region (AA) pattern and a deep-trench (DT) pattern according to another embodiment of the invention. The wafer sample of AA and DT can be observed by a CD-SEM from the top. As shown in FIG. 5B, in the region III of the wafer sample, the deviations between DTs and AAs are measured along both x and y axes. As shown in FIG. 5B, the pattern deviation of region III of DT to AA along x axis is:

$$X_{III} = \frac{(a_1 - a_2)}{2}$$

The pattern deviation of region III of DT to AA along y axis is:

$$Y_{III} = \frac{(b_1 - b_2)}{2}$$

Table 1 lists various overlay patterns, and the deviated orientations, i.e. deviation axis, and corresponding wafer sample structures thereof.

TABLE 1

| The overlay patterns | deviation axis | Wafer sample structure |
|---|---|---|
| AA-DT | X and Y | A wafer sample with a DT pattern |
| GC-DT | Y | A wafer sample with a DT pattern |
| CB-AA | X | A wafer sample with a AA pattern |

TABLE 1-continued

| The overlay patterns | deviation axis | Wafer sample structure |
|---|---|---|
| CB-GC | Y | A wafer sample with a GC pattern |
| CS-GC | Y | A wafer sample with a GC pattern |
| MO-CB | X | A wafer sample with a TEOS pattern |

The "wafer sample structure" in Table 1 represents the first reticle pattern transferred to the wafer of the two reticle patterns. For example, to measure the overlay between reticle patterns of AA and DT, the DT pattern is formed first on the wafer sample and the reticle pattern of AAs transferred to the photoresist layer on the wafer. As shown in Table 1, sequences to form the two overlaid patterns may be different from conventional sequences for fabricating a semiconductor device. However, the sequence in which pattern is formed on a wafer sample depends on the observation under a CD-SEM. Moreover, because millions or even billions of units may be formed on a wafer sample, sampling of the measurement under a CD-SEM is further exemplified by FIGS. 6A to 6C.

Figure 6A:
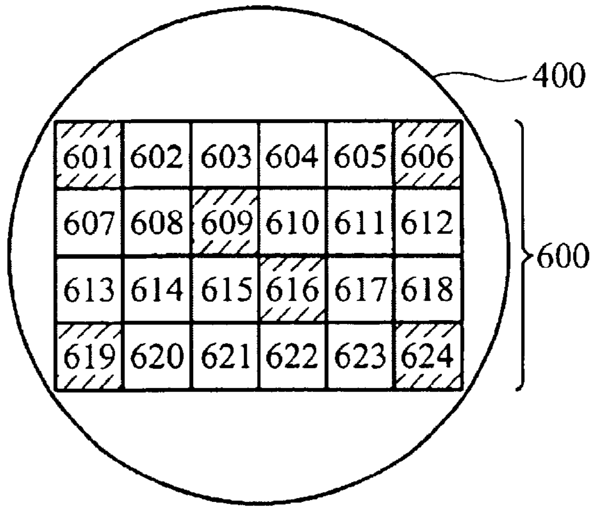
FIGS. 6A to 6C illustrate a sampling method on a wafer sample for measuring deviations of the patterns thereon according to an embodiment of the invention.

FIG. 6A shows a pattern formed by a stepper, which transfers a reticle pattern to the wafer sample 400 step-and-repeatedly 24 times to form a rectangular pattern 600. Due to the increased size of wafers, the pattern on a reticle is transferred to the wafer for A exposures to form a pattern, such as 24 exposures as shown in FIG. 6A. The transferred sub-patterns 601–624 construct a pattern 600. In an embodiment, only 6 sub-patterns, including sub-patterns 601, 606, 619, and 624 on the four corners of the pattern 600 and sub-patterns 609 and 616 on the central area of the pattern 600, are selected for overlay measurement under a CD-SEM. Generally, the sampled sub-patterns B for measurement will not exceed the total sub-patterns A, i.e. the transferred patterns from the reticle pattern. The preferred sampling locations include the sub-patterns at the corners and in the central area of the pattern 600. Generally, the two reticle patterns are patterned by the same stepper and the sub-patterns transferred aligned with each other.

Figure 6B:
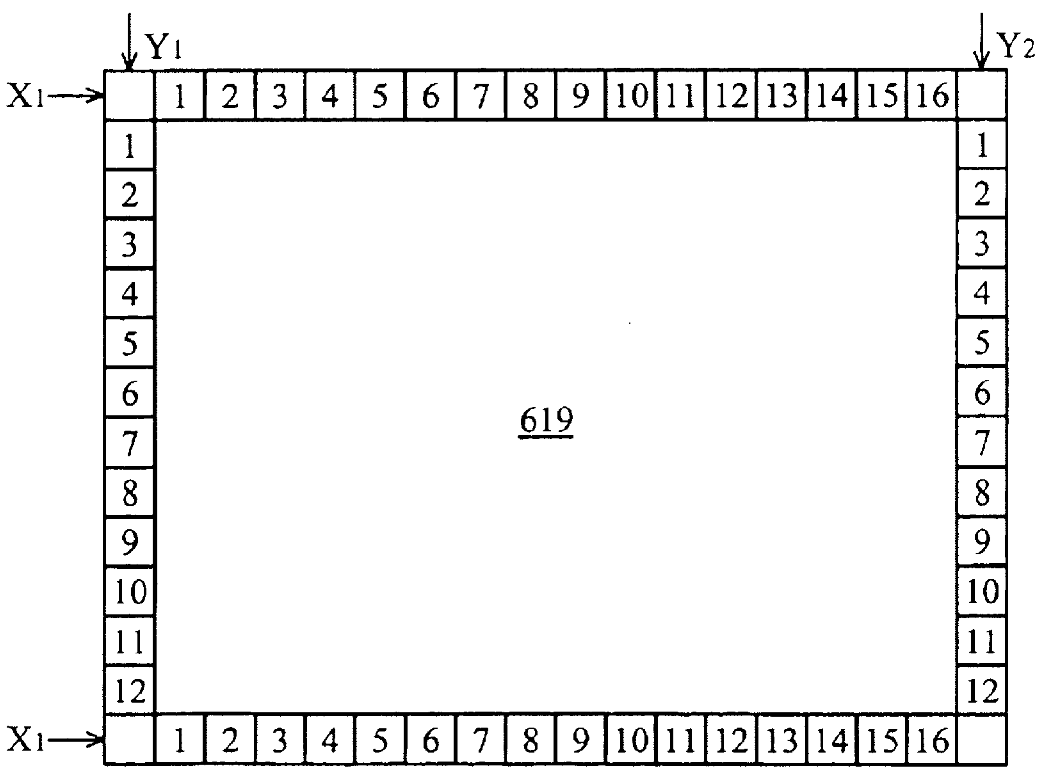

FIG. 6B illustrates measurement of a selected sub-pattern 619 in FIG. 6A. Plural points are selected along the axis to which the two patterns will deviate. For example, because the AA pattern deviates from the DT pattern along both X- and Y-axes as shown in FIG. 5B, sub-pattern 619 is divided into M rows along X-axis and P columns along Y-axis. Each row of the sub-pattern 619 is divided into N points along X-axis and each column of sub-pattern 619 into Q points of sub-pattern 619. If GC-DT patterns are measured, the sub-pattern 619 is only divided into P columns along Y-axis with Q points on each column due to the deviation of GC-DT patterns only along Y-axis.

As shown in FIG. 6B, two rows on the opposite sides of sub-pattern 619, X1 and X2, are selected with 16 points of equal distance on each row. Two columns on the other opposite sides of sub-pattern 619, Y1 and Y2, are selected with 12 points of equal distance on each column. The rows and columns of the sub-pattern 619 can be selected from the lateral area of the sub-pattern 619 or by an equal distance on the surface of the sub-pattern 619. If there is no AA-DT pattern overlaid on the selected point, the AA-DT pattern nearest the selected point is taken for overlay measurement.

Figure 6C:
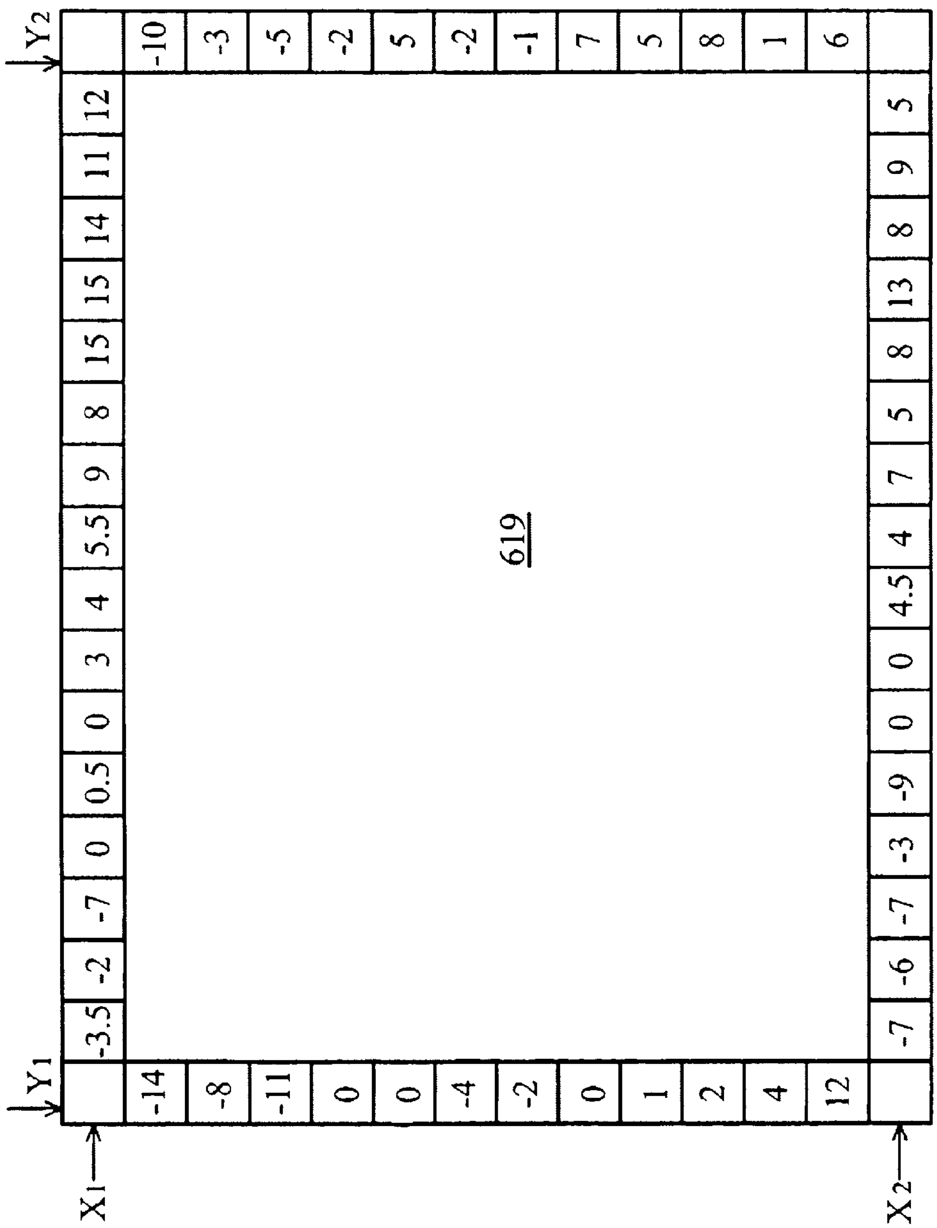

FIG. 6C shows the results of measurement of the sampled points of rows X1 and X2 and columns Y1 and Y2 with a CD_SEM in accordance with FIG. 5C.

As shown in FIG. 3, in step S310, a scaling value and an overlay offset of the deviations are calibrated to obtain an overlay registration value between the first and second patterns.

Figure 7A:
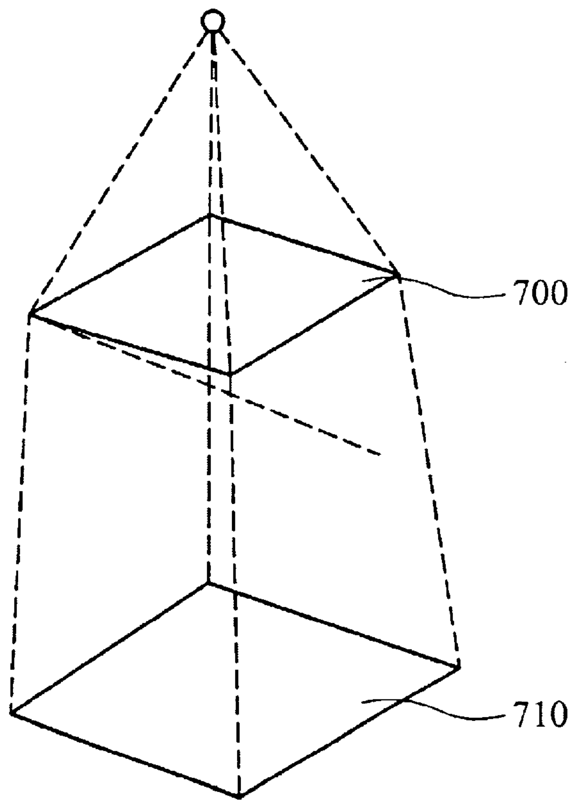
FIG. 7A shows a scaled pattern formed by a reticle pattern according to an embodiment of the invention.
Figure 7B:
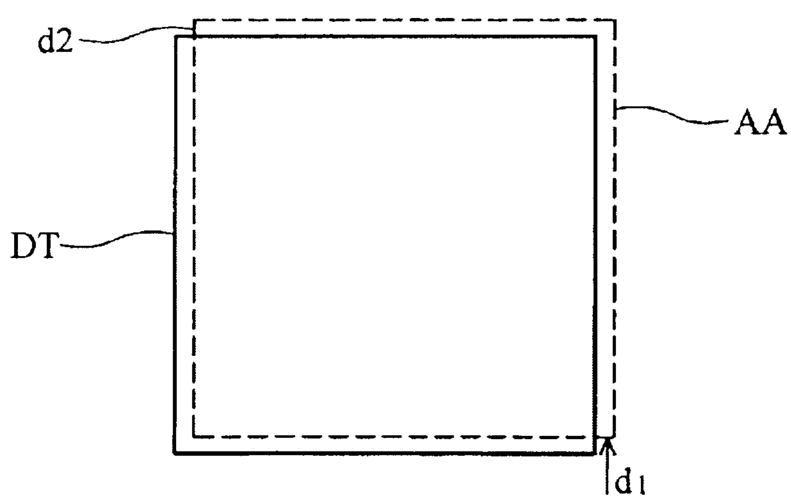
FIG. 7B shows the overlay offset between two patterns according to an embodiment of the invention.

To measure the overlay registration between the two reticle patterns, e.g. AA and DT patterns, precisely, the scaling error and overlay offset during exposure is calibrated. These errors generally result from operation or tool error during photolithography. As shown in FIG. 7, scaling error results from the level shift of reticle 700, thereby forming scaled pattern 710 on the wafer sample. The overlay offset results from misalignment between the reticle pattern and wafer. As shown in FIG. 7B, the overlay offset between the DT pattern to AA pattern is d1 along X axis and d2 along Y axis.

Figure 8A:
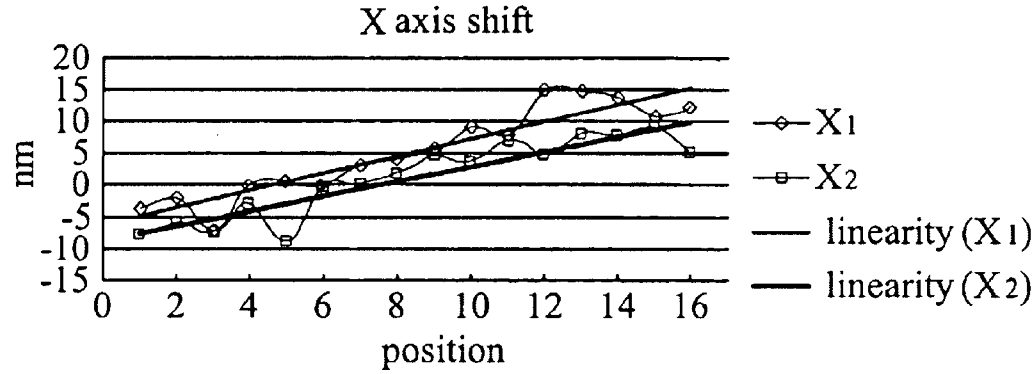
FIGS. 8A and 8B are figures showing deviation curves of FIG. 6C along X- and Y- axis respectively.
Figure 8B:
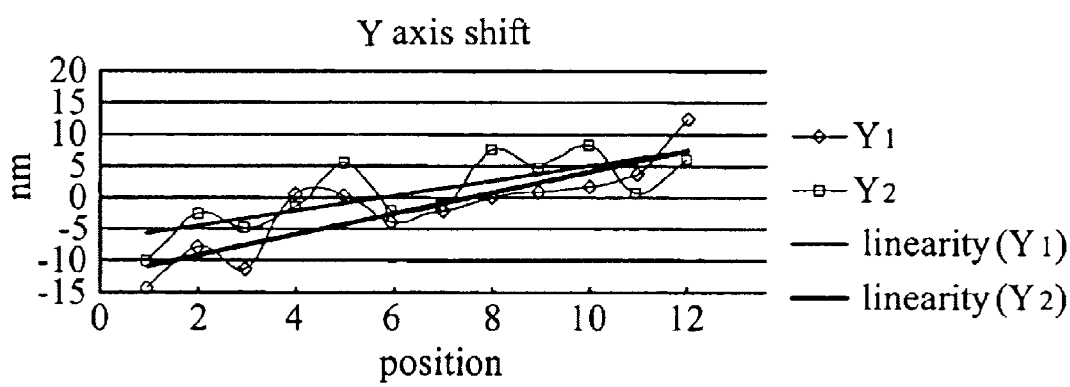

FIGS. 8A to 8D show original and calibrated deviation curves of FIG. 6C along X and Y axes respectively. Deviations in the points on the selected rows and columns shown in FIG. 6C are linearly regressed, and the original regression curves of rows X1 and X2 are shown in FIG. 8A and the original regression curves of columns Y1 and Y2 are shown in FIG. 8B.

Figure 8C:
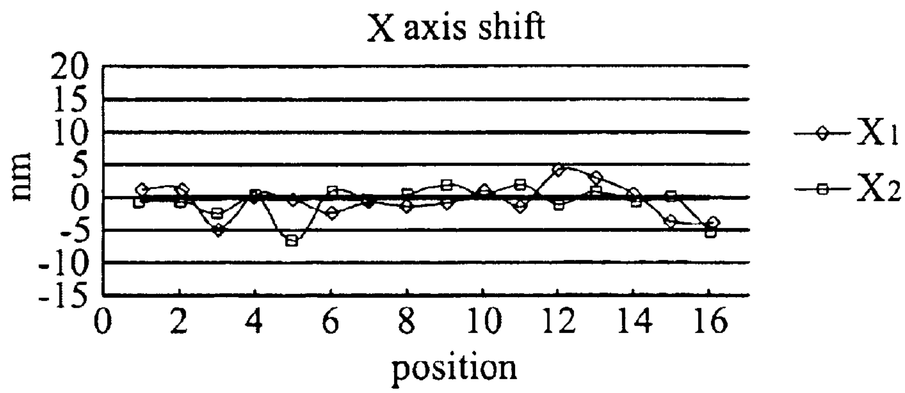
FIGS. 8C and 8D are calibrated figures of FIGS. 8A and 8B respectively after calibrating the scaling values and overlay offsets.
Figure 8D:
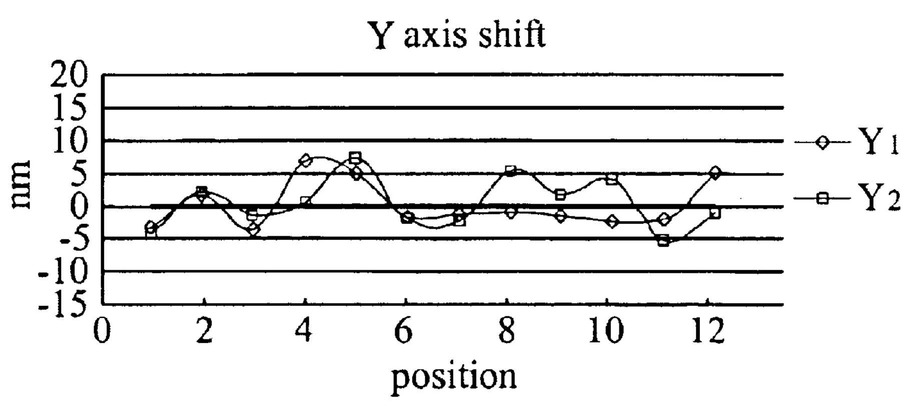

FIGS. 8C and 8D are calibrated figures of FIGS. 8A and 8B respectively after calibrating the scaling values and overlay offsets.

The scaling error of each point of the original regression curves can be calibrated. The scaling error of row X1 can be calibrated as follows:

$$M'_{(X1)n}=m_{(X1)n}-(n-1)\times S_{X1};$$

wherein $m_{(X1)n}$ is the deviation of the $n^{th}$ point on row X1, $S_{X1}$ is the slope (S) of the regression curve of row X1, and $M'_{(X1)n}$ is the deviation with scaling calibration of the $n^{th}$ point on row X1.

Similarly, the scaling error of row X2 can be calibrated as follows:

$$M'_{(X2)n}=m_{(X2)n}-(n-1)\times S_{X2}$$

Similarly, the scaling error of column Y1 can be calibrated as follows:

$$P'_{(Y1)q}=p_{(Y1)q}-(q-1)\times S_{Y1;}$$

wherein $p_{(Y1)q}$ is the deviation of the $q^{th}$ point on column Y1, $S_{Y1}$ is the slope (S) of the regression curve of column Y1, and $M'_{(Y1)q}$ is the deviation with scaling calibration of the $q^{th}$ point on column Y1.

Similarly, the scaling error of column Y2 can be calibrated as follows:

$$P'_{(Y2)q}=p_{(Y2)q}-(q-1)\times S_{Y2}$$

According to the above formulas, the slope (S) of the linear regression curve of each selected row or column is the scaling error of the patterns.

The calibration of overlay offset of each selected row and column on the sub-pattern 619 is performed. In an embodiment, the overlay offsets of X1, X2, Y1 and Y2 are calibrated as follows:

$$O_{X1} = \frac{\sum_{n=1}^{N} M'_{(X1)n}}{N}$$

$$O_{X2} = \frac{\sum_{n=1}^{N} M'_{(X2)n}}{N}$$

$$O_{Y1} = \frac{\sum_{q=1}^{Q} P'_{(Y1)q}}{Q}$$

$$O_{Y2} = \frac{\sum_{q=1}^{Q} P'_{(Y2)q}}{Q}$$

The average value of the deviations calibrated by scaling is the overlay offset of each selected row or column. The deviations calibrated by scaling of each point on X1, X2, Y1 and Y2 are further calibrated with the overlay offsets $O_{X1}$, $O_{X2}$, $O_{Y1}$ and $O_{Y2}$ respectively to obtain registration data thereof as follows:

$$M_{(X1)n}=M'_{(X1)n}-O_{X1}$$

$$M_{(X2)n}=M'_{(X2)n}-O_{X2}$$

$$P_{(Y1)q}=P'_{(Y1)q}-O_{Y1}$$

$$P_{(Y2)q}=P'_{(Y2)q}-O_{Y2}$$

The curve of registration data is shown in FIGS. 8C and 8D. FIGS. 8C and 8D show the registration data of the points in X1 and X2, and Y1 and Y2 respectively, with the calibration of scaling error and overlay offset. Generally, the patterns on two reticles correspond with each other, after the calibration, the curve of the registration data is 0, i.e. overlapping with the X- or Y-axis. However, curves in FIGS. 8C and 8D are not zero, indicating registration of reticles of AA and DT do not 100% correspond to each other. This may result from inherent pattern deviation on the reticle AA and/or reticle DT.

As shown in FIG. 3, in step S312, it is determined whether the registration value is out of a specification. The registration value indicates the overlay accuracy of the reticle pattern. If the registration value shows the overlay error is an inherent error of a reticle, it will be difficult to compensate or calibrate the error during photolithography. The registration data of the selected sub-patterns 601, 606, 619, 624, 609 and 616 of pattern 600 are measured and calibrated with scaling error and overlay offset through steps S308 to S310. Final registration data is further evaluated by statistic methods to determine whether the registration data of two reticles is within a specification. If not, the reticles may need to be reproduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for evaluating overlay registration, comprising:

forming a first pattern on a wafer by photolithography with a first reticle having a first reticle pattern thereon;

forming a photoresist layer on the wafer;

patterning the photoresist layer to form a second pattern by photolithography with a second reticle having a second reticle pattern thereon;

measuring deviations between the first and second patterns on the wafer along X, Y, or X and Y axes;

calibrating a scaling value and an overlay offset of the deviations to obtain an overlay registration value; and determining whether the registration value is out of specification.

2. The method as claimed in claim 1, wherein the first and second reticle patterns are patterns for active regions, gate layers, deep trenches for capacitors, contact openings, bit line openings or a layer of interconnection.

3. The method as claimed in claim 1, wherein the deviations of the wafer are measured with a critical dimension scanning electron microscope (CD-SEM) from the top thereof.

4. The method as claimed in claim 1, wherein the first/second pattern is formed by transferring the first/second reticle pattern step-and-repeatedly onto the wafer/photoresist layer A times, resulting in the first/second pattern consisting of A transferred patterns.

5. The method as claimed in claim 4, wherein deviations between the first and second patterns are measured by selecting B transferred patterns from the A transferred patterns for measurement with B≦A.

6. The method as claimed in claim 5, wherein the first/second pattern consisting of A transferred patterns is rectangular and the B transferred patterns are selected from transferred patterns on the four corners and center of the first/second pattern.

7. The method as claimed in claim 5, wherein the deviations along X or Y axis are calculated by the steps of:

selecting a plurality of points from each of the B transferred patterns along X or Y axis; and measuring the deviations between the first and second patterns on the selective points.

8. The method as claimed in claim 7, wherein the points selected along X-axis are selected from N points in M rows along X axis of each selected transferred pattern, and the points selected along Y axis are selected from Q points in P columns along Y axis of each selected transferred pattern.

9. The method as claimed in claim 8, wherein the scaling value is a slope (S) obtained by linear regression of the deviations of the N point in each row along X axis, or a slope (S) obtained by linear regression of the deviations of the Q point on each column along Y axis.

10. The method as claimed in claim 9, wherein the overlay offset of each selected row or column is an average value of the deviations with scaling calibration.

11. The method as claimed in claim 9, wherein determination of whether the registration value is out of specification is calculated by a statistical method.

12. The method for evaluating overlay registration, comprising:

forming a first pattern on a wafer by photolithography with a first reticle having a first reticle pattern thereon;

forming an anti-reflection layer on the wafer forming a photoresist layer on the anti-reflection layer;

patterning the photoresist layer and the anti-reflection layer to form a second pattern by photolithography with a second reticle having a second reticle pattern thereon;

removal of the anti-reflection layer from the second pattern;

measuring deviation between the first and second patterns on the wafer along X, Y or X and Y axes;

calibrating a scaling value and an overlay offset of the deviations to obtain an overlay registration value; and determining whether the registration value is out of specification.

13. The method as claimed in claim 12, wherein the first and second reticle patterns are patterns of active regions, gate layers, deep trenches for capacitors, contact openings, bit line openings or a layer of interconnection.

14. The method as claimed in claim 13, wherein the deviations of the wafer are measured with a critical dimension scanning electron microscope (CD-SEM) from the top thereof.

15. The method as claimed in claim 12, wherein the first/second pattern is formed by transferring the first/second reticle pattern step-and-repeatedly onto the wafer/photoresist layer A times, resulting in the first/second pattern consisting of A transferred patterns.

16. The method as claimed in claim 15, wherein the deviations between the first and second patterns are measured by selecting B transferred patterns from the A transferred patterns for measurement with B≦A.

17. The method as claimed in claim 16, wherein the first/second pattern consisting of the A transferred patterns is rectangular and the B transferred patterns are selected from transferred patterns on the four corners and center of the first/second pattern.

18. The method as claimed in claim 16, wherein the deviations along X or Y axis is calculated by the steps of:

selecting a plurality of points from each of the B transferred patterns along X- or Y-axis; and measuring the deviations between the first and second patterns on the selective points.

19. The method as claimed in claim 18, wherein the points selected along X-axis are selected from N points in M rows along X-axis of each selected transferred pattern, and the points along Y-axis from Q points in P columns along Y-axis of each selected transferred pattern.

20. The method as claimed in claim 19, wherein the scaling value is a slope (S) obtained by linear regression of the deviations of the N point on each row along X-axis, or a slope (S) obtained by linear regression of the deviations of the Q point on each column along Y axis.

21. The method as claimed in claim 20, wherein the overlay offset of each selected row or column is an average value of the deviations with scaling calibration.

22. The method as claimed in claim 12, wherein determination of whether the registration value is out of specification is calculated by a statistical method.

* * * * *